United States Patent
Winstead et al.

(10) Patent No.: US 9,425,055 B2
(45) Date of Patent: Aug. 23, 2016

(54) SPLIT GATE MEMORY CELL WITH A LAYER OF NANOCRYSTALS WITH IMPROVED ERASE PERFORMANCE

(71) Applicants: Brian A. Winstead, Bridgetown (CA); Ko-Min Chang, Austin, TX (US); Craig T. Swift, Austin, TX (US)

(72) Inventors: Brian A. Winstead, Bridgetown (CA); Ko-Min Chang, Austin, TX (US); Craig T. Swift, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/288,975

(22) Filed: May 28, 2014

(65) Prior Publication Data
US 2015/0349142 A1 Dec. 3, 2015

(51) Int. Cl.
| | | |
|---|---|---|
| G11C 16/04 | (2006.01) | |
| H01L 21/28 | (2006.01) | |
| H01L 29/78 | (2006.01) | |
| H01L 29/423 | (2006.01) | |
| H01L 29/788 | (2006.01) | |

(52) U.S. Cl.
CPC ...... *H01L 21/28282* (2013.01); *G11C 16/0425* (2013.01); *H01L 21/28273* (2013.01); *H01L 29/42328* (2013.01); *H01L 29/42332* (2013.01); *H01L 29/7881* (2013.01)

(58) Field of Classification Search
CPC .. G11C 16/14; G11C 16/0425; H01L 29/792; H01L 29/513; H01L 21/28282; H01L 21/28273; H01L 29/42328; H01L 29/7881; H01L 29/42332
See application file for complete search history.

(56) References Cited

U.S. PATENT DOCUMENTS

| | | | |
|---|---|---|---|
| 2005/0162928 A1* | 7/2005 | Rosmeulen | 365/185.29 |
| 2006/0110883 A1* | 5/2006 | Min | B82Y 10/00 438/260 |
| 2006/0261401 A1* | 11/2006 | Bhattacharyya | 257/316 |
| 2007/0045711 A1* | 3/2007 | Bhattacharyya | H01L 21/28273 257/315 |
| 2007/0176227 A1* | 8/2007 | Liu | B82Y 10/00 257/324 |
| 2007/0297244 A1* | 12/2007 | Wu | 365/185.28 |
| 2009/0042349 A1 | 2/2009 | Prinz et al. | |
| 2009/0103370 A1* | 4/2009 | Lue | 365/185.24 |
| 2012/0248523 A1* | 10/2012 | Shroff et al. | 257/316 |

OTHER PUBLICATIONS

Lue, H.T., "A Novel Gate-Injection Program/Erase P-Channel NAND-Type Flash Memory with High (10M Cycle) Endurance", IEEE 2007 Symposium on VLSI Technology Digest of Technical Papers, Jun. 9-14, 2007, pp. 140-141.

* cited by examiner

Primary Examiner — John H. Hur

(57) ABSTRACT

A semiconductor device includes a semiconductor substrate, a charge storage stack over a portion of the substrate. The charge storage stack includes a first dielectric layer, a layer of nanocrystals in contact with the first dielectric layer, a second dielectric layer over and in contact with the layer of nanocrystals, a nitride layer over and in contact with the second dielectric layer, and a third dielectric layer over the nitride layer.

15 Claims, 6 Drawing Sheets

SPLIT GATE MEMORY CELL WITH A LAYER OF NANOCRYSTALS WITH IMPROVED ERASE PERFORMANCE

BACKGROUND

1. Field

This disclosure relates generally to memories, and more specifically, to split gate memory cells with improved erase performance.

2. Related Art

Split gate non-volatile memories (NVMs) including, for example, split gate flash devices, provide advantages over single-transistor stacked-gated devices such as a control gate over a floating gate. They are particularly useful in the case of the storage element layer being much thinner than the typical floating gate. One type of storage layer that offers benefits is a layer of nanocrystals. A split gate NVM can allow a wider read window because it allows the erased state (typically the low threshold voltage (Vt) state) to be near or below zero Volts. The select transistor in series with the charge storage transistor is able to keep the bitcell "off" when it is unselected and the charge storage transistor's Vt is near or less than zero Volts. This cannot be done in a single transistor NVM because if it has a low or negative threshold it will be conducting or leaking when it is unselected. So, a split gate bitcell can permit a larger read window because it allows the erased Vt to be low.

When erase of a nanocrystal bitcell is accomplished by Fowler-Nordheim (FN) tunneling, the erased Vt will usually saturate when the number of electrons tunneling out of the nanocrystals through one dielectric is balanced by electrons tunneling onto the nanocrystals through another dielectric. When erase is performed by FN tunneling of electrons through the oxide between the nanocrystals and the overlying control gate (top oxide), eventual saturation of erase will occur when FN tunneling of electrons from the substrate to the nanocrystals occurs through the bottom oxide. The conduction of electrons from the substrate to the nanocrystals during erase is referred to as back injection. Erase saturation occurs because the electric fields in the two dielectrics become equal near the end of erase, thus FN tunneling becomes the same in both dielectrics. This erase saturation limits the Vt window of the bitcell. When the Vt window of the bitcell is limited, the useful life of the memory suffers, because it becomes increasingly difficult for the circuitry to correctly sense a programmed or erased bitcell as other mechanisms shift the Vt of the bitcells from their original programmed or erased states.

It is therefore desirable to provide split NVM with nanocrystals with an enlarged window of threshold voltage and rapid erase capability.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of split gate non-volatile memory cells and methods for forming the same disclosed herein include a layer of nanocrystals overlaid with a thin layer of nitride. The layer of nitride is overlaid by a top oxide layer to create a higher electric field between the nanocrystal and the nitride layer compared to the electric field between the nitride layer and the control gate material. The asymmetric field enables strong electron injection from the nanocrystals to the gate. Back injection of tunneling electrons from the substrate to the nanocrystals is reduced because of the relatively lower field in the dielectric between the nanocrystals and the substrate.

Figure 1:
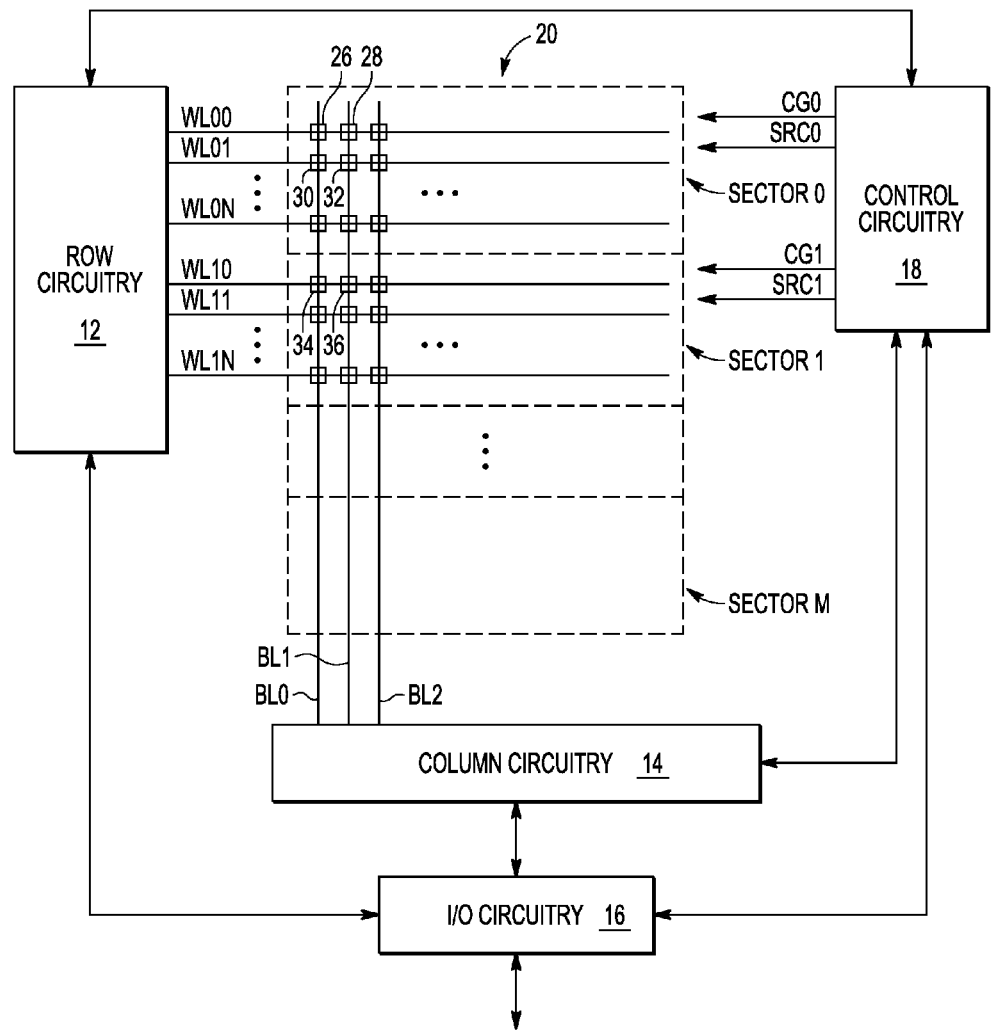
FIG. 1 illustrates, in block diagram form, a memory system having a memory array in accordance with one embodiment of the present disclosure.

FIG. 1 illustrates, in block diagram form, a memory system 10 in accordance with one embodiment of the present disclosure. Memory system 10 includes a split gate memory cell array 20 which includes a plurality of memory cells, such as memory cells 26, 28, 30, 32, 34, and 36. Array 20 may be partitioned into any number of sectors. In the illustrated embodiment, array 20 includes M+1 sectors, such as sector 0, sector 1, . . . , sector M. Memory 10 also includes row circuitry 12, column circuitry 14, control circuitry 18, and I/O circuitry 16. Control circuitry 18 is coupled to each of row circuitry 12 and column circuitry 14, and column circuitry 14 is coupled to I/O circuitry 16. I/O circuitry 16 is also coupled to row circuitry 12 and control circuitry 18. Array 20 includes any number of bit lines, including BL0, BL1, BL2, etc. Each of these bit lines is coupled to column circuitry 14 which may includes the appropriate sensing and writing circuitry to read/write to the bit cells of array 20.

Each sector of array 20 includes any number of word lines. For example, sector 0 includes N+1 word lines: WL00, WL01, . . . , WL0N, and sector 1 includes N+1 word lines: WL10, WL11, . . . , WL1N. Each of these word lines is coupled to row circuitry 12. A memory cell is coupled to the intersection of each word line and bit line. In the illustrated embodiment, memory cell 26 is coupled to WL00 and BL0 and is in sector 0, memory cell 28 is coupled to WL00 and BL1 and is in sector 0, memory cell 30 is coupled to WL01 and BL0 and is in sector 0, memory cell 32 is coupled to WL01 and BL1 and is in sector 0, memory cell 34 is coupled to WL10 and BL0 and is in sector 1 and memory cell 36 is coupled to WL10 and BL1 and is in sector 1. Note that each word line may be referred to as a row and each bit line as a column of array 20.

As will be described in further detail below, row circuitry 12 provides the appropriate voltage values to each of the word lines, in which the word lines are coupled to the select gates of each memory cell. I/O circuitry 16 communicates with row circuitry 12, column circuitry 14, and control circuitry 18 as needed to read and write array 20. Control circuitry 18 also provides the appropriate voltage values for the control gates and the source terminals of each memory cell of array 20. For example, the control gate of each memory cell of sector 0 is coupled to receive control gate voltage CG0, the source terminal of each memory cell of sector 0 is coupled to receive source terminal voltage SRC0, the control gate of each memory cell of sector 1 is coupled to receive control gate voltage CG1, and the source terminal of each memory cell of sector 1 is coupled to receive source terminal voltage SRC1. In the illustrated embodiment, each memory cell within a sector receives the same control gate voltage and the same source terminal voltage. That is, in the illustrated embodiment, note that, within each sector, the control gate voltage (e.g. CG0, CG1, etc.) is a common voltage node and the source terminal voltage (e.g. SRC0, SRC1, etc.) is a common voltage node.

Figure 2:
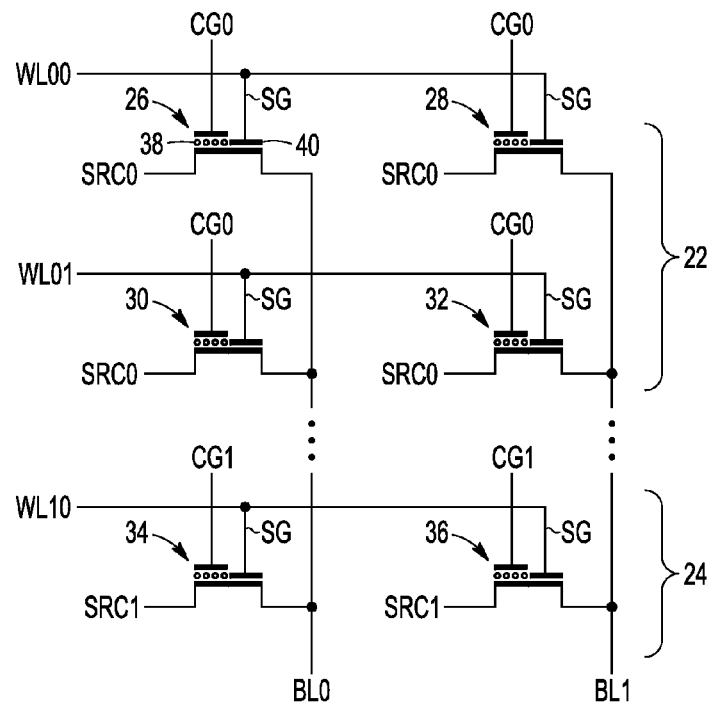
FIG. 2 illustrates, in schematic form, a portion of the memory array of FIG. 1 in further detail, in accordance with one embodiment of the present disclosure.

FIG. 2 illustrates a portion of array 20 in further detail including memory cells 26, 28, 30, 32, 34, and 36. Memory cell 26 has a control gate coupled to receive CG0, a select gate coupled to WL00, a source terminal coupled to receive SRC0, and a drain terminal coupled to BL0. Memory cell 28 has a control gate coupled to receive CG0, a select gate coupled to WL00, a source terminal coupled to receive SRC0, and a drain terminal coupled to BL1. Memory cell 30 has a control gate coupled to receive CG0, a select gate coupled to WL01, a source terminal coupled to receive SRC0, and a drain terminal coupled to BL0. Memory cell 32 has a control gate coupled to receive CG0, a select gate coupled to WL01, a source terminal coupled to receive SRC0, and a drain terminal coupled to BL1. Memory cell 34 has a control gate coupled to receive CG1, a select gate coupled to WL10, a source terminal coupled to receive SRC1, and a drain terminal coupled to BL0. Memory cell 36 has a control gate coupled to receive CG1, a select gate coupled to WL10, a source terminal coupled to receive SRC1, and a drain terminal coupled to BL1.

During an erase operation, a plurality of memory cells of array 20 are selected by accessing the common control gates within a sector (for example: CG0). The control gate CG0 will be driven to a positive voltage to enable tunneling erase of the nanocrystals while the common source within that sector (for example SRC0) is at or near ground potential . . . .

Tunneling is used to move electrons from nanocrystals 38 of the memory cell 26 during the erase operation by establishing a positive bias between the control gate and a substrate 40. Electrons move between the nanocrystals 38 and the control gate material, such as a polysilicon. In order to improve performance during the erase operation, a thin dielectric layer and a layer of nitride (not shown) are overlaid on top of the nanocrystals 38 to increase the field between the nanocrystals 38 and the layer of nitride (not shown), as further described with reference to FIGS. 3-12. This thin dielectric layer and a layer of nitride also decrease the tunneling distance and the action integral for electrons exiting the nanocrystals so that the erase performance is improved.

Figure 3:
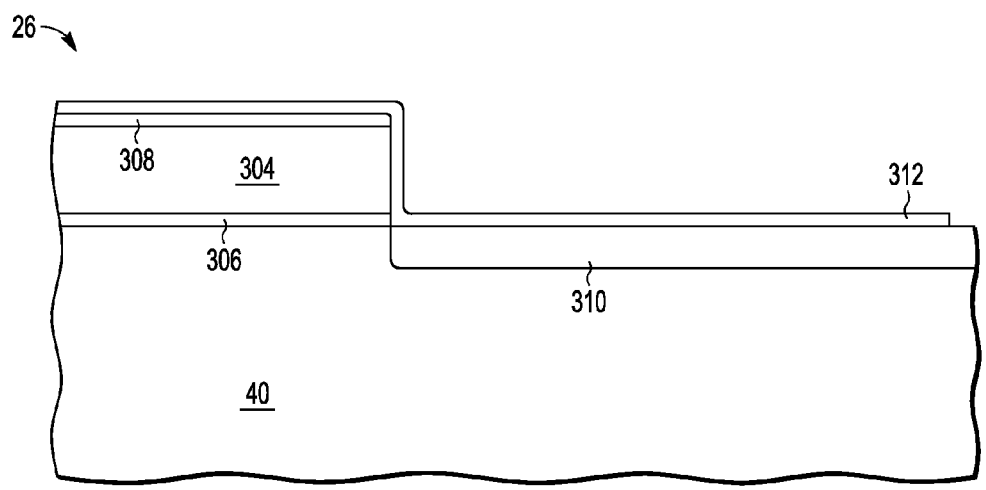
FIGS. 3-9 illustrate a side cross-section view of a memory cell at progressive stages in processing according to a first embodiment.

FIGS. 3-9 illustrate a cross-section view of memory cell 26 at progressive stages in fabrication according to a first embodiment. Shown in FIG. 3 is an embodiment of memory cell 26 comprising a semiconductor substrate 40, a gate dielectric 306 on semiconductor substrate 40, a conductive layer 304, which will be used for a select gate, over gate dielectric 306, and an antireflective coating (ARC) 308 on conductive layer 304. The semiconductor substrate 40 can be any semiconductor material or combinations of materials, such as gallium arsenide, silicon germanium, silicon-on-insulator (SOI), silicon, monocrystalline silicon, the like, and combinations of the above. Gate dielectric 306 may be a grown oxide which is common for gate dielectrics and may be 2 nanometers or other suitable dimension in thickness. A high K dielectric may also be used and would likely have a different thickness.

Conductive layer 304 may be doped polysilicon 150 nanometers thick in this example but could be another suitable material and thickness. Conductive layer 304 and gate dielectric 306 have been etched according to a pattern. For the case of gate dielectric 306 being silicon oxide, etching can be achieved using a reactive ion etch (RIE) or an HF wet etch. Another isotropic etch may be used. For the case of gate dielectric 306 being a high K dielectric, a different etchant, one that is selective between the high K dielectric and the semiconductor material of substrate 40, could be used.

After etching gate dielectric 306, another oxide layer (not shown) may be formed and partially removed by patterned etching. After the selected portion of gate dielectric 306 is removed, an implant of dopant type opposite that of substrate 40 which may be called counterdoping, may be performed to form doped region 310 in substrate 40. Typically, substrate 40 would have a light P doping. In this example region 310 is N type resulting from the implantation.

A bottom oxide or dielectric layer 312 is grown or deposited on the exposed portion of reflective layer 308, an exposed sidewall of conductive layer 304 adjacent doped region 310, and over doped region 310. Dielectric layer 312 may have a low dielectric constant (e.g., silicon oxide) or a relatively high dielectric constant greater than approximately 7-7.5 (i.e., greater than silicon nitride). Dielectric layer 312 may be about 40 to 100 Angstroms or other suitable dimension in thickness.

Figure 4:
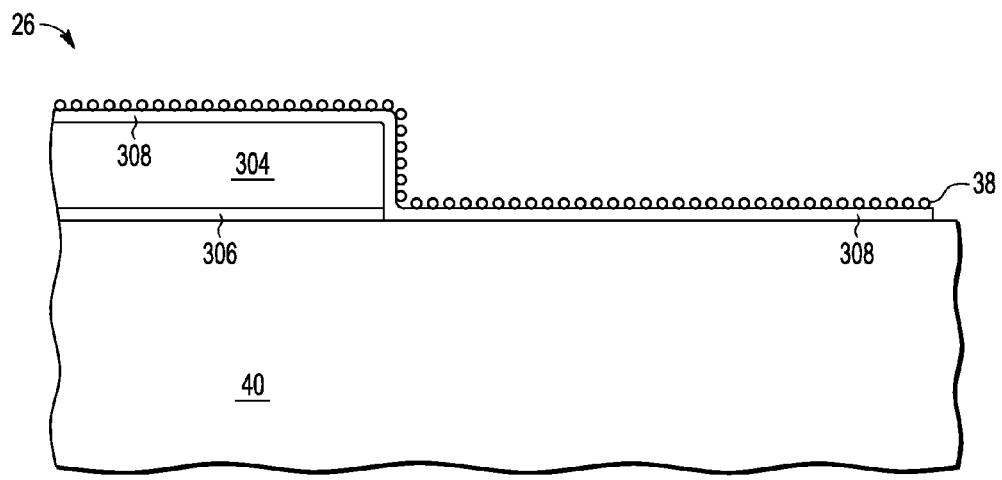

Shown in FIG. 4 is an embodiment of semiconductor memory cell 26 after forming a charge storage layer over dielectric layer 312. The charge storage layer may be formed by depositing and annealing discrete storage elements of polysilicon, germanium, metal, silicon carbide, or other suitable metal or silicon material or any combinations of these materials. In the illustrated embodiment, the charge storage layer includes small circles representing nanocrystals 38. Nanocrystals 38 may be between 5 and 20 nanometers (nm) thick. The top surface of nanocrystals 38 has a relatively small radius of curvature to increase the asymmetry of field, for example less than 10-nm. Dielectric layer 312 may be a thermal layer in order to withstand the heat of nanocrystal formation. A high-k dielectric material may be used as dielectric layer 312 with metal nanocrystals or when a lower temperature silicon nanocrystal formation process is used.

Figure 5:
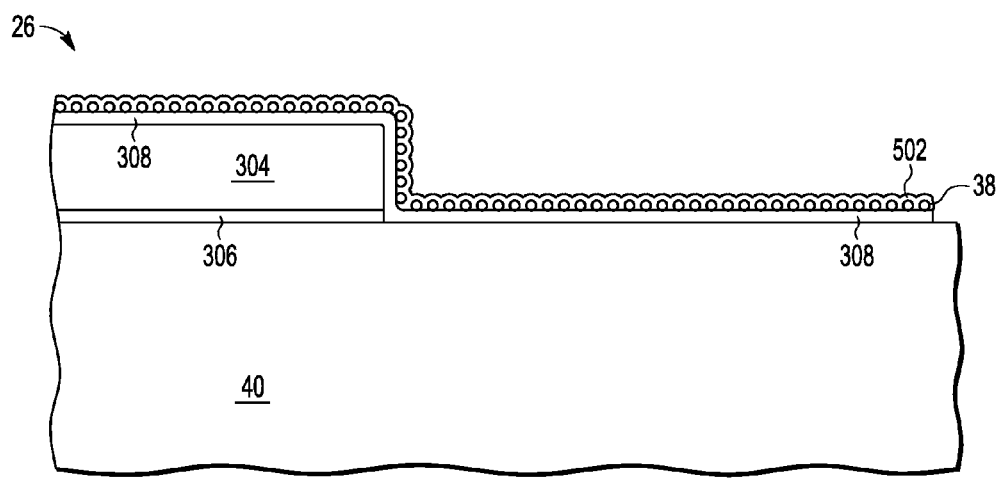

Shown in FIG. 5 is an embodiment of semiconductor memory cell 26 after a thin oxide or dielectric layer 502 is deposited over the charge storage layer 38. Layer 502 may be formed of a suitable dielectric material such as silicon dioxide having a thickness between approximately 20 and 30 Angstroms over charge storage layer 38.

Figure 6:
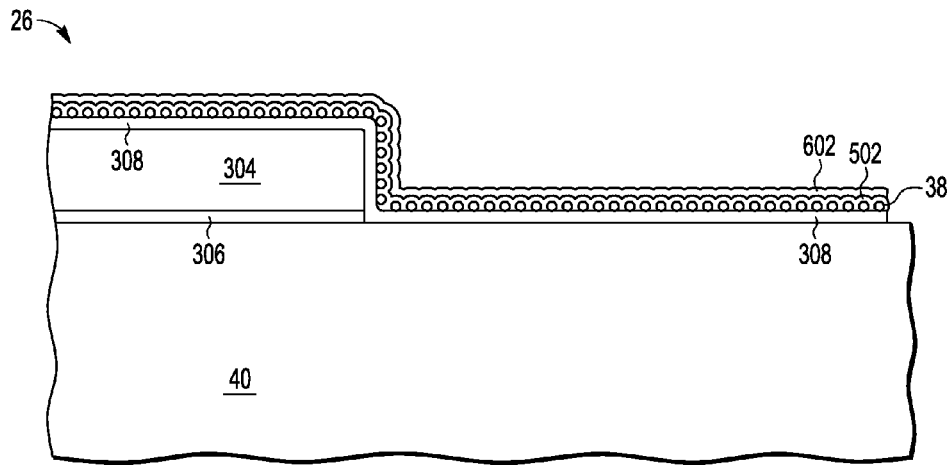

Shown in FIG. 6 is an embodiment of semiconductor memory cell 26 after nitride layer 602 is formed over oxide layer 502. Layer 602 may be formed of silicon nitride having a thickness less than or equal to approximately 20 Angstroms over oxide layer 502.

Figure 7:
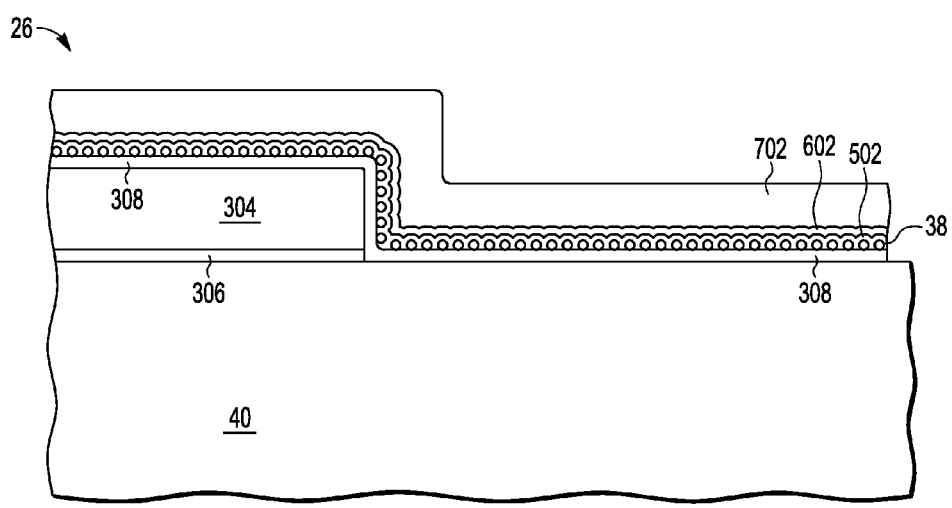

Shown in FIG. 7 is an embodiment of semiconductor memory cell 26 after oxide or dielectric layer 702 is formed over nitride layer 602. Dielectric layer 702 may be formed of a suitable dielectric material such as silicon dioxide having a thickness of approximately 100 Angstroms. Dielectric layer 702 can be greater than 100 Angstroms without adversely affecting the speed of the erase operation, and also increases the threshold voltage window, however the thickness of dielectric layer 702 can be chosen to avoid trap-up in which charged particles are trapped in the dielectric and can cause an undesired threshold voltage shift in the memory cell. The combination of dielectric layer 308, nanocrystals 38, dielectric layer 502, nitride layer 602, and dielectric layer 702 is referred to as a charge storage stack.

Figure 8:
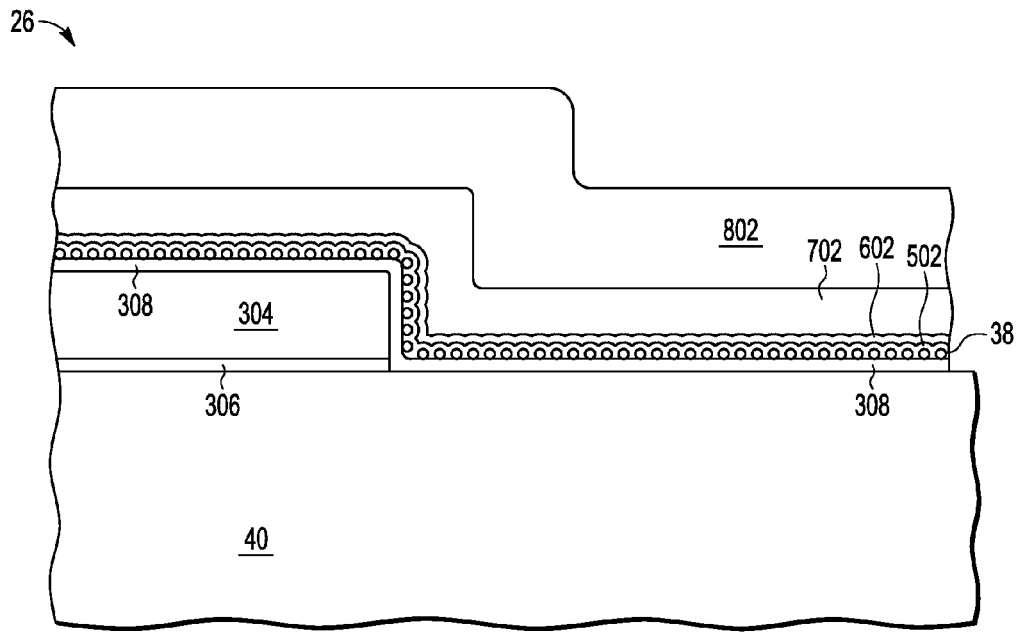

Shown in FIG. 8 is an embodiment of semiconductor memory cell 26 after conformally depositing a conductive layer 802 over dielectric layer 702. Conductive layer 802 may be doped polysilicon which is convenient from a processing perspective but could be another conductive material or combination of materials. Conductive layer 802 will be patterned in subsequent steps to form a control gate.

Figure 9:
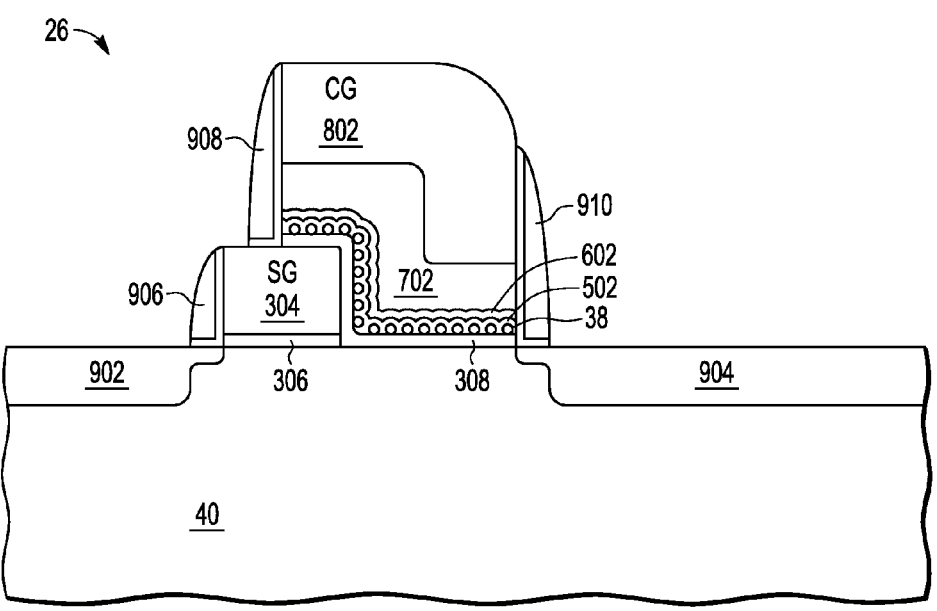

Shown in FIG. 9 is an embodiment of semiconductor memory cell 26 after dielectric layer 308, charge storage layer 38, dielectric layer 502, nitride layer 602, dielectric layer 702 and conductive layers 304 and 802 have been patterned in an overlapping split gate structure. One or more implants may be performed before and after forming spacers 906, 908, 910 around exposed sidewalls of the remaining portions of conductive layers 304 and 802 to result in a non-volatile memory (NVM) cell 26 with the resulting portion of conductive layer 304 forming a select gate and the resulting portion of conductive layer 802 forming a control gate. In some embodiments, an array of split-gate type NVM cells 26-36 as shown for example in FIG. 2 can be formed on a single substrate 40.

Semiconductor memory cell 26 may undergo further processing as known by those skilled in the art such as, for example, siliciding source 904, drain 902, and exposed portions of conductive layers 304, 802 using conventional processing techniques. In addition, one or more metal interconnect layers (not shown) may be formed to provide electrical connections for components on semiconductor memory cell 26.

Also note that a number of intermediate steps have been left out of the description, such as for example, formation of shallow trench isolation (STI), various cleaning steps, multiple steps of gate dielectric formation, various implants, anneal steps, and the like, that one of ordinary skill in the art would know are necessary or desirable in the manufacture of an integrated circuit. Additionally, the geometry and placement of conductive layers 304, 802 and the charge storage stack may vary from what is shown in FIGS. 3-9.

Figure 10:
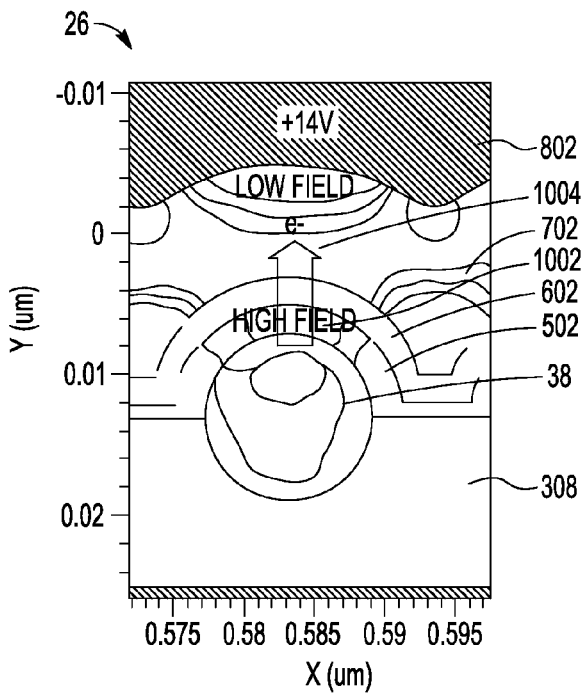
FIG. 10 illustrates a detailed view of asymmetrical electrical fields in a memory cell in accordance with one embodiment of the present disclosure.

FIG. 10 illustrates a detailed side cross-sectional view of asymmetrical electrical fields around nanocrystal 38 in memory cell 26 during an erase operation in accordance with one embodiment of the present disclosure. A first field 1002 exists in dielectric layer 502 between nanocrystal 38 and nitride layer 602. A second field 1004 exists in the dielectric layer 702 between nitride layer 602 and conductive layer 802. The strength of first field 1002 is greater than the strength of second field 1004. The high strength of field 1002 causes electrons to be pulled out of nanocrystal 38. Removing electrons from nanocrystals 38 with the stronger field results in a faster, more complete erase of charge stored in nanocrystals 38 than in memory cells that do not include nitride layer 602 and additional dielectric layer 502.

Figure 11:
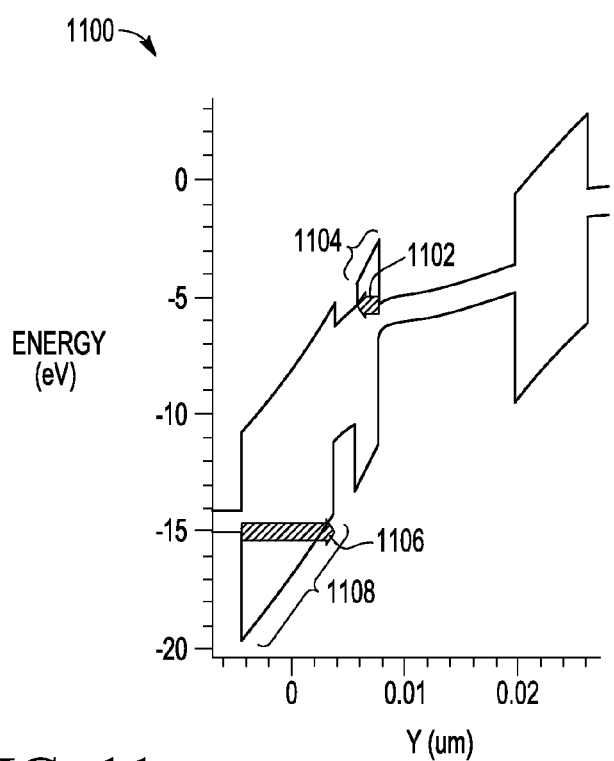
FIG. 11 illustrates a energy band diagram for the memory cell of FIG. 10 in accordance with one embodiment of the present disclosure.

Referring to FIGS. 10 and 11, FIG. 11 illustrates an energy band diagram 1100 versus distance for the memory cell 26 of FIG. 10 in accordance with one embodiment of the present disclosure. Arrow 1102 is shown extending across band 1104 representing conduction band energy in dielectric layer 502 as electrons tunnel out of nanocrystal 38 to conduction layer 802. A conduction band offset in the nitride layer reduces the tunneling distance for the electrons as indicated by arrow 1102. This increases the rate of tunneling of electrons from the nanocrystals 38 to conductive layer 802. Another related effect of the presence of the nitride layer conduction band offset is that it reduces the action integral which also serves to increase the electron tunneling rate. In addition, using a nanocrystal as the storage medium increases the field in layer 502 due to the curvature of the nanocrystal, which also serves to increase the rate of electron tunneling. In one embodiment, the nanocrystals 38 can be made of metal or silicide to further increase the field in layer 502.

As described above, improved erase speed and window are achieved in one embodiment by increasing the electron tunneling from nanocrystals 38 to conduction layer 802. Hole tunneling from layer 802 to nanocrystals 38 is not used, which materially improves the erase speed. This is indicated by arrow 1106 which shows the tunneling distance for such holes is not reduced by the presence of nitride layer 602. In addition the curvature of the nanocrystal tends to reduce the field in dielectric layer 702 which further reduces hole tunneling.

The increased electron tunneling rates described above are affected by the location of the nitride layer relative to the nanocrystal. Dielectric layer 502 can have a thickness selected to achieve full benefits of reducing the tunneling distance and reduced action. In one embodiment, dielectric layer 502 is between two and three nanometers thick to achieve both benefits.

Additionally, the thickness of nitride layer 602 affects the improvement in electron tunneling rates achieved between nanocrystals 38 and layer 802. If nitride layer 602 is too thin, there may be less reduction of the action integral and the tunneling distance. If nitride layer 602 is too thick, trapping of electrons may occur in nitride layer 602. In one embodiment, the nitride layer is approximately two nanometers thick.

In one embodiment dielectric layer 702 may range in thickness from 20 to 120 Angstroms. However, a thicker layer 702 serves to reduce coupling, which improve erase window. Accordingly, in another embodiment, layer 702 can range in thickness from 80 to 120 Angstroms.

By now it should be understood that in some embodiments, there has been provided a semiconductor device that can include a semiconductor substrate (40) and a charge storage stack over a portion of the substrate. The charge storage stack can include a first dielectric layer (308), a layer of nanocrystals (38) in contact with the first dielectric layer (308), a second dielectric layer (502) over and in contact with the layer of nanocrystals (38), a nitride layer (602) over and in contact with the second dielectric layer (502), and a third dielectric layer (702) over the nitride layer (602).

In another aspect, during an erase operation, a first electric field between the layer of nanocrystals (38) and the nitride layer (602) can be greater than a second electric field between the nitride layer (602) and the control gate layer (802).

In another aspect, the semiconductor device (10 or 26) can be a split gate non-volatile memory cell.

In another aspect, the second dielectric layer (502) can be between approximately 20 and 30 Angstroms thick.

In another aspect, the nitride layer (602) can be less than or equal to 20 Angstroms thick.

In another aspect, the third dielectric layer (702) can be approximately 100 Angstroms thick.

In another aspect, the nanocrystals (38) can be at least one of a group consisting of: made of metal and are silicided.

In another aspect, the thickness of the third dielectric layer (702) can be at least one of a group consisting of: greater than the thickness of the second dielectric layer (502), and greater than a combined thickness of the second dielectric layer (502) and the nitride layer (602).

In another aspect, the control gate layer (802) can be a conformally applied layer of polysilicon.

In another aspect, the thicknesses of the second dielectric layer (502) and the nitride layer (602) are selected to decrease the threshold voltage of the memory cell through electron tunneling between the nanocrystals (38) and the nitride layer (602) during an erase operation.

In another embodiment, a non-volatile memory device can comprise an array of memory cells on a semiconductor substrate (40). Each of the memory cells can include a charge storage stack having a first dielectric layer (308), a layer of nanocrystals (38) in contact with the first dielectric layer (308), a second dielectric layer (502) over the layer of nanocrystals (38), a nitride layer (602) over the second dielectric layer (502), and a third dielectric layer (702) over the nitride layer (602).

In another aspect, during an erase operation, a first electric field between the layer of nanocrystals (38) and the nitride layer (602) is greater than a second electric field between the nitride layer (602) and a control gate layer (802).

In another aspect, the second dielectric layer (502) can be between approximately 20 and 30 Angstroms thick.

In another aspect, the nitride layer (602) can be less than or equal to 20 Angstroms thick.

In another aspect, the third dielectric layer (702) can be between approximately 80 and 120 Angstroms thick.

In another aspect, the nanocrystals (38) can be at least one of a group of: made of metal and silicided.

In another aspect, a radius of a top of the nanocrystals (38) adjacent the second dielectric layer (502) can be less than ten nanometers.

In another aspect, the memory cells are split gate memory cells that further comprise a select gate structure and a control gate layer (802).

In another aspect, the thicknesses of the second dielectric layer (502) and the nitride layer (602) can be selected to decrease the threshold voltage of the memory cell through electron tunneling between the nanocrystals (38) and the nitride layer (602) during an erase operation.

In other embodiments, a method of making a non-volatile memory device can comprise forming a charge storage stack over the semiconductor substrate (40). The charge storage stack can include forming a first dielectric layer (308), forming a layer of nanocrystals (38) over the first dielectric layer (308), depositing a second dielectric layer (502) over the layer of nanocrystals (38), depositing a nitride layer (602) over the second dielectric layer (502), and depositing a third dielectric layer (702) over the nitride layer (602).

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, different split gate configurations may be used to implement each memory cell other than the configuration shown in FIG. 9. Further, the use of a nitride layer 602 between dielectric layers 502 and 702 over a layer of nanocrystals 38 can be used in other types of transistors in a memory cell, such as single transistor memory cell, in addition to split gate and multiple transistor memory cells. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a semiconductor substrate;
   a charge storage stack over a portion of the substrate, the charge storage stack including:
      a first dielectric layer;
      a layer of nanocrystals in contact with the first dielectric layer;
      a second dielectric layer over and in contact with the layer of nanocrystals;
      a nitride layer over and in contact with the second dielectric layer; and
      a third dielectric layer over the nitride layer, wherein the nanocrystals are between 5 and 20 nanometers thick, the nitride layer is less than or equal to 20 Angstroms thick, the second dielectric layer is between 20 and 30 Angstroms thick, and the third dielectric layer is between 80 and 120 Angstroms thick.

2. The semiconductor device of claim 1 further comprising:
   a control gate layer over the third dielectric layer, wherein during an erase operation, a first electric field between the layer of nanocrystals and the nitride layer is greater than a second electric field between the nitride layer and the control gate layer.

3. The semiconductor device of claim 1, wherein the semiconductor device is a split gate non-volatile memory cell.

4. The semiconductor device of claim 1 wherein the nanocrystals are at least one of a group consisting of: made of metal and are silicided.

5. The semiconductor device of claim 1 wherein the thickness of the third dielectric layer is at least one of a group consisting of: greater than the thickness of the second dielectric layer, and greater than a combined thickness of the second dielectric layer and the nitride layer.

6. The semiconductor device of claim 2 wherein the control gate layer is a conformally applied layer of polysilicon.

7. The semiconductor device of claim 1 wherein the semiconductor device is a memory cell; and the thicknesses of the second dielectric layer and the nitride layer are selected to decrease the threshold voltage of the memory cell through electron tunneling between the nanocrystals and the nitride layer during an erase operation.

8. A non-volatile memory device comprising:
an array of memory cells on a semiconductor substrate, each of the memory cells including:
   a charge storage stack including:
      a first dielectric layer;
      a layer of nanocrystals in contact with the first dielectric layer;
      a second dielectric layer over the layer of nanocrystals;
      a nitride layer over the second dielectric layer; and
      a third dielectric layer over the nitride layer, wherein nanocrystals are between 5 and 20 nanometers thick, the nitride layer is less than or equal to 20 Angstroms thick, the second dielectric layer is between 20 and 30 Angstroms thick, and the thickness of the third dielectric layer is greater than a combined thickness of the second dielectric layer and the nitride layer.

9. The non-volatile memory device of claim 8 wherein during an erase operation, a first electric field between the layer of nanocrystals and the nitride layer is greater than a second electric field between the nitride layer and a control gate layer.

10. The non-volatile memory device of claim 8 wherein the third dielectric layer is between 80 and 120 Angstroms thick.

11. The non-volatile memory device of claim 8 wherein the nanocrystals are at least one of a group of: made of metal and silicided.

12. The non-volatile memory device of claim 8 wherein a radius of a top of the nanocrystals adjacent the second dielectric layer is less than ten nanometers.

13. The non-volatile memory device of claim 8, wherein the memory cells are split gate memory cells further comprising:
   a select gate structure; and
   a control gate layer.

14. The non-volatile memory device of claim 8 wherein the thicknesses of the second dielectric layer and the nitride layer are selected to decrease the threshold voltage of the memory cell through electron tunneling between the nanocrystals and the nitride layer during an erase operation.

15. A method of making a non-volatile memory device comprising:
forming a charge storage stack over a semiconductor substrate including:
   forming a first dielectric layer;
   forming a layer of nanocrystals over the first dielectric layer;
   depositing a second dielectric layer over the layer of nanocrystals;
   depositing a nitride layer over the second dielectric layer; and
   depositing a third dielectric layer over the nitride layer, wherein the nanocrystals are between 5 and 20 nanometers thick, the nitride layer is less than or equal to 20 Angstroms thick, the second dielectric layer is between 20 and 30 Angstroms thick, and the third dielectric layer is between 80 and 120 Angstroms thick.

\* \* \* \* \*